(12) United States Patent
Chen et al.

(10) Patent No.: US 8,502,723 B2
(45) Date of Patent: Aug. 6, 2013

(54) METHOD AND APPARATUS FOR EVALUATING WEIGHTING OF ELEMENTS OF DAC AND SAR ADC USING THE SAME

(75) Inventors: Hung-I Chen, Hsinchu County (TW); Chang-Yu Chen, Kaohsiung (TW); Xuan-Lun Huang, Changhua County (TW); Jiun-Lang Huang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 71 days.

(21) Appl. No.: 13/338,214

(22) Filed: Dec. 27, 2011

(65) Prior Publication Data

US 2013/0113638 A1    May 9, 2013

(30) Foreign Application Priority Data

Nov. 4, 2011  (TW) .................................. 100140408

(51) Int. Cl.
*H03M 1/34*  (2006.01)
(52) U.S. Cl.
USPC .......................................... 341/163; 341/120
(58) Field of Classification Search
USPC ................. 341/144, 155, 163, 172, 162, 120
See application file for complete search history.

(56) References Cited

U.S. PATENT DOCUMENTS

| | | | |
|---|---|---|---|
| 4,336,526 A | 6/1982 | Weir | |
| 6,348,885 B1 | 2/2002 | Munoz et al. | |
| 6,404,375 B1 | 6/2002 | Munoz et al. | |
| 6,417,794 B1 | 7/2002 | Munoz et al. | |
| 6,486,806 B1 | 11/2002 | Munoz et al. | |
| 7,173,557 B2 | 2/2007 | Kuttner | |
| 7,408,490 B2 | 8/2008 | Melanson et al. | |
| 7,724,174 B2 | 5/2010 | Chang et al. | |
| 7,741,985 B2 * | 6/2010 | Kubota et al. | 341/150 |
| 7,773,020 B2 | 8/2010 | Hurrell | |
| 7,812,757 B1 * | 10/2010 | Wong et al. | 341/172 |
| 7,839,319 B2 | 11/2010 | Nittala et al. | |
| 8,134,487 B2 * | 3/2012 | Harpe | 341/163 |
| 8,143,912 B2 * | 3/2012 | Hsiao et al. | 326/30 |
| 8,289,198 B2 * | 10/2012 | Agarwal et al. | 341/172 |
| 8,390,501 B2 * | 3/2013 | Chang et al. | 341/163 |
| 2011/0122006 A1 | 5/2011 | Liao et al. | |
| 2012/0146829 A1 * | 6/2012 | Baghini et al. | 341/161 |

FOREIGN PATENT DOCUMENTS

TW          201119243           6/2011

OTHER PUBLICATIONS

Franz Kuttner, "A 1.2 V 10b 20MSample/s Non-Binary Successive Approximation ADC in 0.13 μm CMOS", 2002 IEEE International Solid-State Circuits Conference, Feb. 2002.
Hesener et al., "A 14b 40MS/s Redundant SAR ADC with 480MHz Clock in 0.13 μm CMOS", 2007 IEEE International Solid-State Circuits Conference, Feb. 2007.

(Continued)

*Primary Examiner* — Peguy Jean Pierre
(74) *Attorney, Agent, or Firm* — Jianq Chyun IP Office

(57) ABSTRACT

A method and an apparatus for evaluating weighting of elements of a DAC and a SAR ADC using the same are provided. An equivalent weighting of each composed element is obtained by adding a reference element with a reference weighting, an auxiliary DAC, and a search circuit into the SAR ADC, and the equivalent weighting is represented by the reference weighting. The SAR ADC can calculate and then obtain a correct digital output by using the calibrated equivalent weighting and the successive approximation result of each input signal. The present disclosure prevents the necessity of matching each composed element of the DAC in the SAR ADC.

28 Claims, 12 Drawing Sheets

(56) References Cited

OTHER PUBLICATIONS

Liu et al., "A 600MS/s 30mW 0.13 µm CMOS ADC Array Achieving Over 60dB SFDR with Adaptive Digital Equalization", 2009 IEEE International Solid-State Circuits Conference, Feb. 2009.

Liu et al., "A 12b 22.5/45MS/s 3.0mW 0.059mm2 CMOS SAR ADC Achieving Over 90dB SFDR", 2010 IEEE International Solid-State Circuits Conference, Feb. 2010.

Ogawa et al., "Non-binary SAR ADC with Digital Error Connection for Low Power Applications", Circuits and Systems (APCCAS), 2010 IEEE Asia Pacific Conference on, Dec. 6-9, 2010, 196-199.

\* cited by examiner $$V_{digi} = \frac{1}{C_{total}} * \left( \sum_{n=0}^{i-1} K_{n,i} * C_n + K_{ref,i} * C_{ref} \right)$$

METHOD AND APPARATUS FOR EVALUATING WEIGHTING OF ELEMENTS OF DAC AND SAR ADC USING THE SAME

CROSS-REFERENCE TO RELATED APPLICATION

This application claims the priority benefit of Taiwan application serial no. 100140408, filed on Nov. 4, 2011. The entirety of the above-mentioned patent application is hereby incorporated by reference herein and made a part of this specification.

BACKGROUND

1. Technical Field

The technical field relates to a digital-to-analog converter (DAC), and more particularly to a method and an apparatus for evaluating weighting of elements of the DAC, and a successive-approximated register analog-to-digital converter (SAR ADC) using the same.

2. Related Art

In recent years, integrated circuit design has been trending towards increasingly difficult demands on lowering power consumption and cost along with enhancing higher performance. In the design of front-end analog circuits, an efficient analog-to-digital converter (ADC) can drastically enhance the overall system performance. The ADC is responsible for converting the received analog signals into digital signals, and providing the digital signals for the operation of the back-end digital signal processing unit. Therefore, characteristics of the ADC such as its dynamic range, resolution, accuracy, linearity, sampling speed, power consumption, and its input stage are crucial factors which influence the overall system performance, and these characteristics serve as several parameters for evaluating the performance of the ADC.

For two categories in resolution and sampling speed, the application range of an ADC with 8-14 bits and one to several hundred mega samples per second (MSPS) is quite broad. Applications such as in the front-end of the base frequency or the intermediate frequency of a communication system, a biomedical imaging process such as the front-end of a ultrasonic imaging system, and the front-end of a laser array system are all within the range of applications. The ADC has many types of configurations, and when manufacturing an ADC matching the aforementioned specifications, a diverse array of configurations can be chosen. The mainstream ADC applied commercially is the pipeline analog-to-digital converter, or the pipeline ADC. However, in recent years, articles in prominent international journals have gravitated towards the successive-approximated register analog-to-digital converter (SAR ADC) as a popular research direction, because the SAR ADC configuration almost does not require a direct current bias voltage. Since the SAR ADC requires a good amount of digital circuits for control and signal processing, when the manufacturing process enters the deep sub-micron, the chip area and the power consumption needed for a portion of the digital circuits can be effectively reduced. Accordingly, the SAR ADC is suitable for developing the intellectual property from a large scale system-on-chip (SoC). In many disclosures, the SAR ADC has lower consumption and smaller chip area when compared to the pipeline ADC with the same specification requirements. Therefore, the technical development of the SAR ADC framework has become an active field of research.

However, a major functional block exists in the SAR ADC configuration: the digital-to-analog converter (DAC), which directly influences the performance of the SAR ADC. Due to the strong necessity of matching among each of the composed elements in the DAC, such as the capacitor, the DAC takes up a significant portion of the overall chip area and the power consumption of the SAR ADC. Thus, when the DAC requires a larger area, the driving circuit of the DAC also requires a larger driving force, and this further increases the area and power consumption. Since the cost of digital circuits is low, if the matching requirement the DAC places on each of the composed elements can be reduced or eliminated by adopting processing techniques using digital circuits, the overall chip area and power consumption of the ADC can be lowered.

FIG. 1 is a block diagram of a SAR ADC. FIG. 2A is a simplified circuit diagram of a DAC and a comparator in a SAR ADC during a sampling phase. FIG. 2B is a Thenevin equivalent circuit diagram of the circuit depicted in FIG. 2A. FIG. 2C is a simplified circuit diagram of a DAC and a comparator in a SAR ADC during a conversion phase. FIG. 2D is a Thenevin equivalent circuit diagram of the circuit depicted in FIG. 2C. Please refer to FIGS. 1, 2A, 2B, 2C, and 2D. A SAR ADC 10 includes a DAC 12, a sample and hold circuit 14, a comparator 16, and a successive-approximated register logic (SAR logic) circuit 18. The DACs depicted in FIGS. 2A, 2B, 2C, and 2D are formed by N capacitors $C_0$, $C_1, \ldots, C_{N-1}$, and these capacitors have a capacitance of radix 2:

$$C_n = 2^n \ast C.$$

in which N is a positive integer greater than 1, and n is a positive integer greater than or equal to 0 and less than N. Therefore, as shown in FIG. 2D, after the successive approximation, the SAR logic circuit 18 transmits a N-bit control signal to the DAC 12, that is the last ADC digital output value $ADC_{OUT}$, in which all of the bit values $K_0, K_1, \ldots, K_{N-1}$ of the control signal equals 0 or 1. However, the linearity of the ADC is directly affected by the difference between the actual value and the ideal value of the capacitor.

FIG. 3 is a diagram illustrating a typical conversion function of the SAR ADC depicted in FIG. 1. Please refer to FIG. 3. A circular dotted line 32 represents a condition referred to as a missing decision level, and this condition occurs when a plurality of different input voltages may exist, with no corresponding different digital output values or the same digital output values. Accordingly, a linear conversion curve cannot be obtained by digital compensation. A circular dotted line 34 represents another condition referred to as a missing code, and this condition occurs when two adjacent input voltages correspond to two digital output values of an extremely large numerical difference. However, a linear conversion curve can still be obtained by digital compensation. As shown in FIG. 3, the DAC in a conventional ADC has a capacitance of a power of 2. Therefore, the missing decision level condition is generated, and this condition cannot be compensated digitally.

SUMMARY

According to an exemplary embodiment, a method for evaluating weighting of elements of a digital-to-analog converter (DAC) is provided, in which the DAC includes N composed elements represented by $E_0, E_1, \ldots E_{N-1}$, and the method includes the following steps. In one step, a reference element $E_{ref}$ coupled to the DAC is provided. In another step, during a first phase of an $0^{th}$ period, a first value $V_1$ is inputted for the composed element $E_0$ and a second value $V_0$ is inputted for the other composed elements $E_1, \ldots, E_{N-1}$, so an equivalent open circuit output is $V_{MCW0}$. In one step, during a second phase of the $0^{th}$ period, the second value $V_0$ is inputted for all of the composed elements $E_0, E_1, \ldots, E_{N-1}$, and the input value of the reference element $E_{ref}$ is adjusted, so the equivalent open circuit output $V_{dig0}$ is approximately equal to $V_{MCW0}$. According to the input value of the reference element $E_{ref}$, a rational multiple $K_{ref,0}$ less than 1 is obtained. The weighting value of the composed element $E_0$ can be evaluated according to the rational multiple $K_{ref,0}$. In another step, during the first phase of an $i^{th}$ period, the first value $V_1$ is inputted for the composed element $E_i$, and the second value $V_0$ is inputted for the other composed elements $E_0, \ldots, E_{i-1}$, $E_{i+1}, \ldots, E_{N-1}$, so the equivalent open circuit output is $V_{MCWi}$. In one step, during the second phase of the $i^{th}$ period, the second value $V_0$ is inputted for the composed elements $E_i$, $E_{i+1}, \ldots, E_{N-1}$ labeled greater than or equal to i, the input value of the reference element $E_{ref}$ is adjusted, and one of the first value $V_1$ and the second value $V_0$ is selected as the input values of the composed elements $E_0, E_1, \ldots, E_{i-1}$, so the equivalent open circuit output $V_{digi}$ is approximately equal to $V_{MCWi}$. Moreover, according to the input value of the reference element $E_{ref}$ and the input values of composed elements $E_0, E_1, \ldots, E_{i-1}$, the coefficients $K_{0,i}, K_{1,i}, \ldots, K_{i-1,i}$ and a rational multiple $K_{ref,i}$ less than 1 are obtained. According to the coefficients $K_{0,i}, K_{1,i}, \ldots, K_{i-1,i}$ and the rational multiple $K_{ref,i}$, the weighting value of the composed element $E_i$ can be evaluated, in which N is a positive integer greater than 1, and i is a positive integer greater than or equal to 0 and less than N.

According to an exemplary embodiment, an evaluation apparatus for evaluating weighting of elements of a DAC is provided, in which the DAC includes N composed elements represented by $E_0, E_1, \ldots E_{N-1}$, and the evaluation apparatus includes a reference element $E_{ref}$, an auxiliary DAC, a comparator, and a search circuit. The reference element $E_{ref}$ is coupled to the DAC, and the weighting values of the reference element $E_{ref}$ and the composed elements satisfy:

$$W_{ref} > W_0, \text{ and}$$

$$\sum_{n=0}^{i-1} W_n + W_{ref} > W_i,$$

in which $W_{ref}$ is the weighting value of $E_{ref}$, $W_i$ is the weighting value of $E_i$, N is a positive integer greater than 1, and i and n are both positive integers greater than or equal to 0 and less than N. The auxiliary DAC has a M-bit digital input and an output coupled to the reference element $E_{ref}$, in which M is a positive integer greater than 1 The comparator has a first input terminal, a second input terminal, and an output terminal. The comparator is adapted for comparing the inputs of the first input terminal and the second input terminal, and outputting a comparison result at the output terminal. The search circuit is coupled to the comparator, the auxiliary DAC, and the DAC. The search circuit is adapted for selecting one of a first value $V_1$ and a second value $V_0$ as the input values of all of the composed elements $E_0, E_1, \ldots, E_{N-1}$ according to an output of the comparator. Moreover, according to the output of the comparator, the search circuit changes the binary values of the M-bit input of the auxiliary DAC, so as to adjust the input value of the reference element $E_{ref}$. According to the binary values of the M-bit input of the auxiliary DAC and the input values of all the composed elements, the weighting values of all the composed elements are evaluated.

According to an exemplary embodiment, an evaluation apparatus for evaluating weighting of elements of a DAC is provided, in which the DAC includes N composed elements represented by $E_0, E_1, \ldots E_{N-1}$, and the evaluation apparatus includes a reference element $E_{ref}$, an auxiliary DAC, a comparator, a successive-approximated register (SAR) logic circuit, and a search control circuit. The reference element $E_{ref}$ is coupled to the DAC, and the weighting values of the reference element $E_{ref}$ and the composed elements satisfy:

$$W_{ref} > W_0, \text{ and}$$

$$\sum_{n=0}^{i-1} W_n + W_{ref} > W_i,$$

in which $W_{ref}$ is the weighting value of $E_{ref}$, $W_i$ is the weighting value of $E_i$, N is a positive integer greater than 1, and i and n are both positive integers greater than or equal to 0 and less than N. The auxiliary DAC has a M-bit digital input and an output coupled to the reference element $E_{ref}$, in which M is a positive integer greater than 1. The comparator has a first input terminal, a second input terminal, and an output terminal. The comparator is adapted for comparing the inputs of the first input terminal and the second input terminal, and outputting a comparison result at the output terminal. The SAR logic circuit is coupled to the comparator, the auxiliary DAC, and the DAC. The search control circuit is coupled to the SAR logic circuit, and the search control circuit controls the SAR logic circuit to select one of the first value $V_1$ and the second value $V_0$ as the input values of all of the composed elements $E_0, E_1, \ldots, E_{N-1}$ according to an output of the comparator. Moreover, according to the output of the comparator, the binary values of the M-bit input of the auxiliary DAC are changed, so as to adjust the input value of the reference element $E_{ref}$. According to the binary values of the M-bit input of the auxiliary DAC and the input values of all the composed elements, the evaluation apparatus evaluates the weighting values of all the composed elements.

According to an exemplary embodiment, a successive-approximated register analog-to-digital converter (SAR ADC) is provided, including a DAC, a reference element $E_{ref}$, an auxiliary DAC, a comparator, a SAR logic circuit, and a search circuit. The DAC includes N composed elements represented by $E_0, E_1, \ldots, E_{N-1}$. The reference element $E_{ref}$ is coupled to the DAC, and the weighting values of the reference element $E_{ref}$ and the composed elements satisfy:

$$W_{ref} > W_0, \text{ and}$$

$$\sum_{n=0}^{i-1} W_n + W_{ref} > W_i,$$

in which $W_{ref}$ is the weighting value of $E_{ref}$, $W_i$ is the weighting value of $E_i$, N is a positive integer greater than 1, and i and n are both positive integers greater than or equal to 0 and less than N. The auxiliary DAC has a M-bit digital input and an output coupled to the reference element $E_{ref}$, in which M is a positive integer greater than 1. The comparator has a first input terminal, a second input terminal, and an output terminal. The comparator is adapted for comparing the inputs of the first input terminal and the second input terminal, and outputting a comparison result at the output terminal. The SAR logic circuit is coupled to the comparator and the DAC, and the SAR logic circuit is adapted for selecting one of a first value $V_1$ and a second value $V_0$ as the input values of all of the composed elements $E_0, E_1, \ldots, E_{N-1}$ according to an output of the comparator, so as to obtain a corresponding digital value of an input voltage. The search circuit is coupled to the comparator, the auxiliary DAC, and the DAC. According to the output of the comparator, the search circuit selects one of the first value $V_1$ and the second value $V_0$ as the input values of the composed elements $E_0, E_1, \ldots, E_{N-1}$. Moreover, according to the output of the comparator, the search circuit changes the binary values of the M-bit input of the auxiliary DAC, so as to adjust the input value of the reference element $E_{ref}$. According to the binary values of the M-bit input of the auxiliary DAC and the input values of all the composed elements, the SAR ADC evaluates the weighting values of all the composed elements.

According to an exemplary embodiment, a SAR ADC is provided, including a DAC, a reference element $E_{ref}$, an auxiliary DAC, a comparator, a SAR logic circuit, and a search control circuit. The DAC includes N composed elements represented by $E_0, E_1, \ldots, E_{N-1}$. The reference element $E_{ref}$ is coupled to the DAC, and the weighting values of the reference element $E_{ref}$ and the composed elements satisfy:

$$W_{ref} > W_0, \text{ and}$$

$$\sum_{n=0}^{i-1} W_n + W_{ref} > W_i,$$

in which $W_{ref}$ is the weighting value of $E_{ref}$, $W_i$ is the weighting value of $E_i$, N is a positive integer greater than 1, and i and n are both positive integers greater than or equal to 0 and less than N. The auxiliary DAC has a M-bit digital input and an output coupled to the reference element $E_{ref}$, in which M is a positive integer greater than 1. The comparator has a first input terminal, a second input terminal, and an output terminal. The comparator is adapted for comparing the inputs of the first input terminal and the second input terminal, and outputting a comparison result at the output terminal. The SAR logic circuit is coupled to the comparator, the auxiliary DAC, and the DAC, and the SAR logic circuit is adapted for selecting one of a first value $V_1$ and a second value $V_0$ as the input values of all of the composed elements $E_0, E_1, \ldots, E_{N-1}$ according to an output of the comparator, so as to obtain a corresponding digital value of an input voltage. The search control circuit is coupled to the SAR logic circuit, and the search control circuit controls the SAR logic circuit to select one of the first value $V_1$ and the second value $V_0$ as the input values of all of the composed elements $E_0, E_1, \ldots, E_{N-1}$ according to the output of the comparator. Moreover, according to the output of the comparator, the binary values of the M-bit input of the auxiliary DAC are changed, so as to adjust the input value of the reference element $E_{ref}$. According to the binary values of the M-bit input of the auxiliary DAC and the input values of all the composed elements, the SAR ADC evaluates the weighting values of all the composed elements.

Several exemplary embodiments accompanied with figures are described in detail below to further describe the disclosure in details.

BRIEF DESCRIPTION OF THE DRAWINGS

The accompanying drawings constituting a part of this specification are incorporated herein to provide a further understanding of the disclosure. Here, the drawings illustrate embodiments of the disclosure and, together with the description, serve to explain the principles of the disclosure.

DESCRIPTION OF EMBODIMENTS

Figure 1:
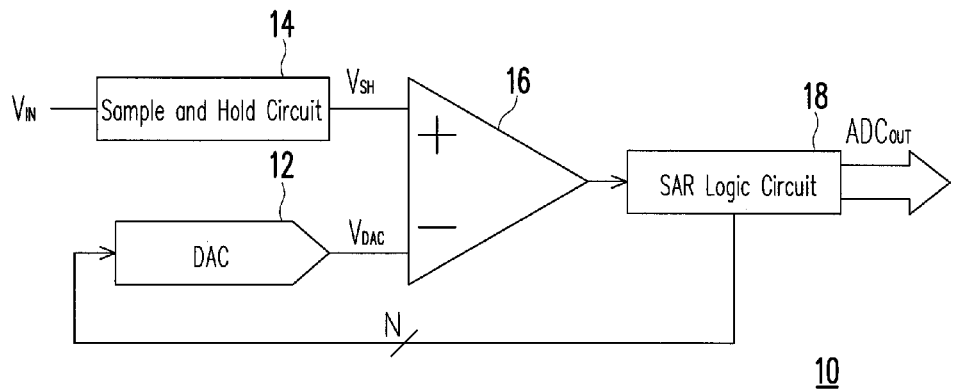
FIG. 1 is a block diagram of a SAR ADC.
Figure 2A:
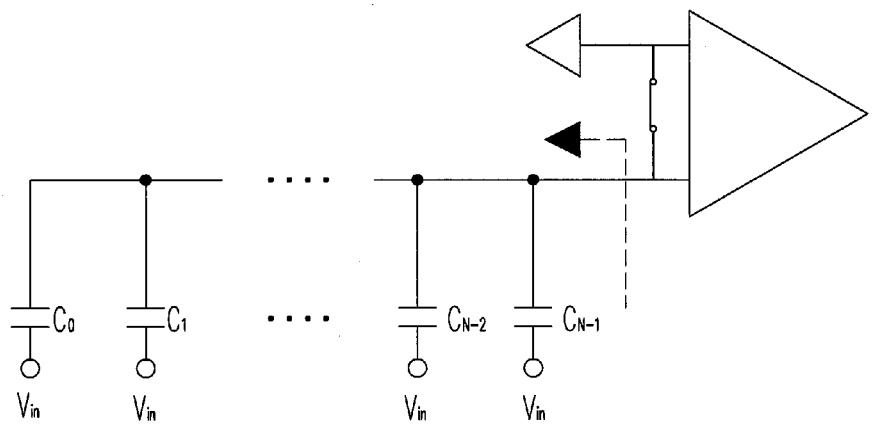
FIG. 2A is a simplified circuit diagram of a DAC and a comparator in a SAR ADC during a sampling phase.
Figure 2B:
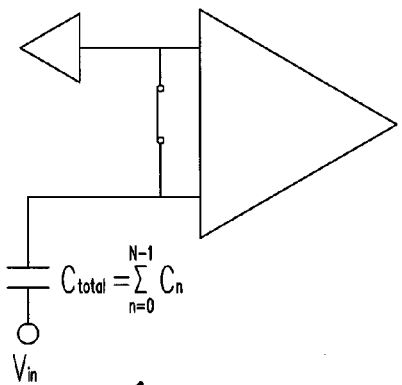
FIG. 2B is a Thenevin equivalent circuit diagram of the circuit depicted in FIG. 2A.
Figure 2C:
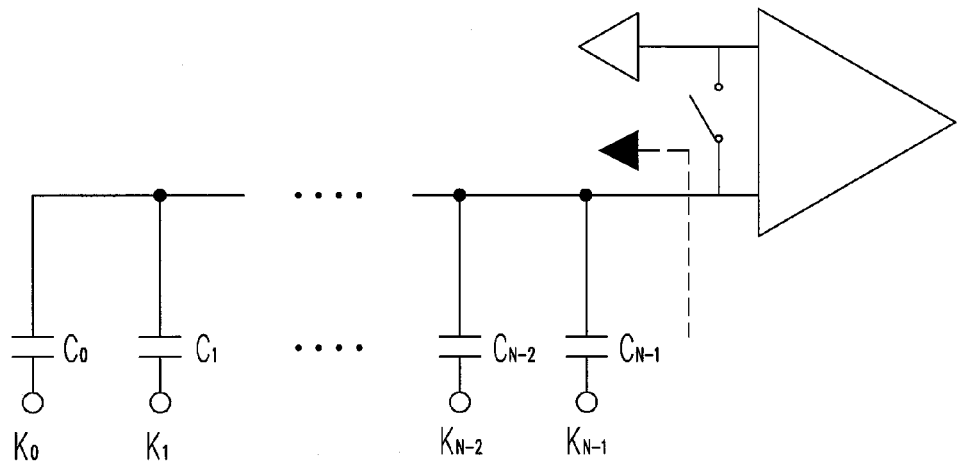
FIG. 2C is a simplified circuit diagram of a DAC and a comparator in a SAR ADC during a conversion phase.
Figure 2D:
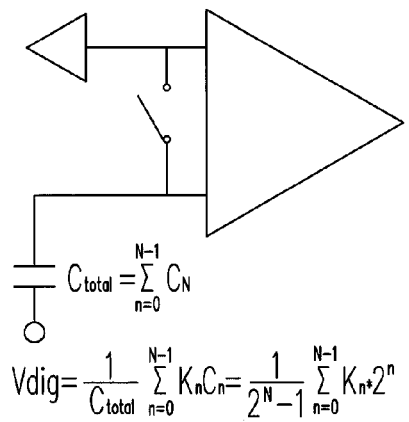
FIG. 2D is a Thenevin equivalent circuit diagram of the circuit depicted in FIG. 2C.
Figure 3:
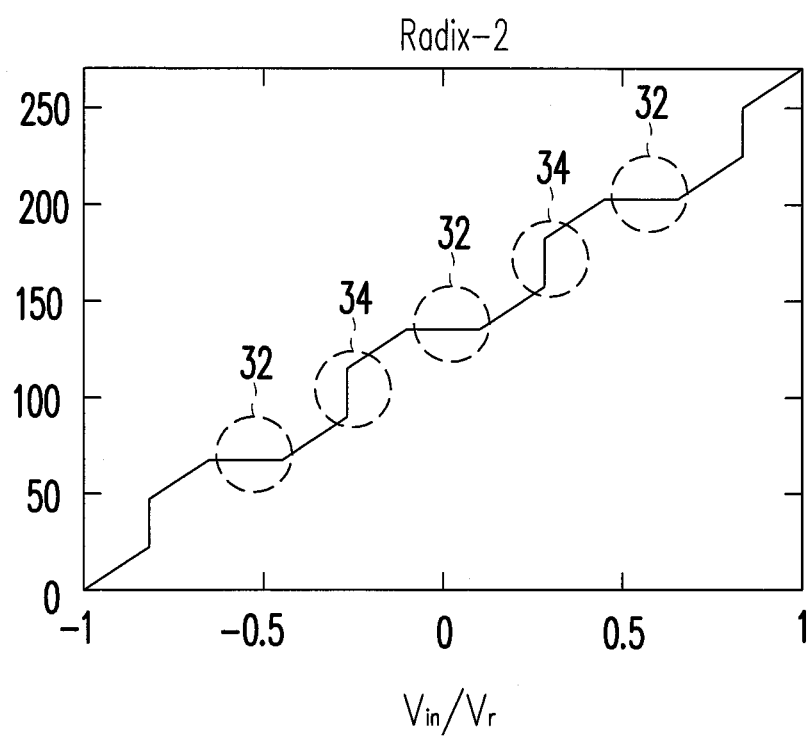
FIG. 3 is a diagram illustrating a typical conversion function of the SAR ADC depicted in FIG. 1.
Figure 4:
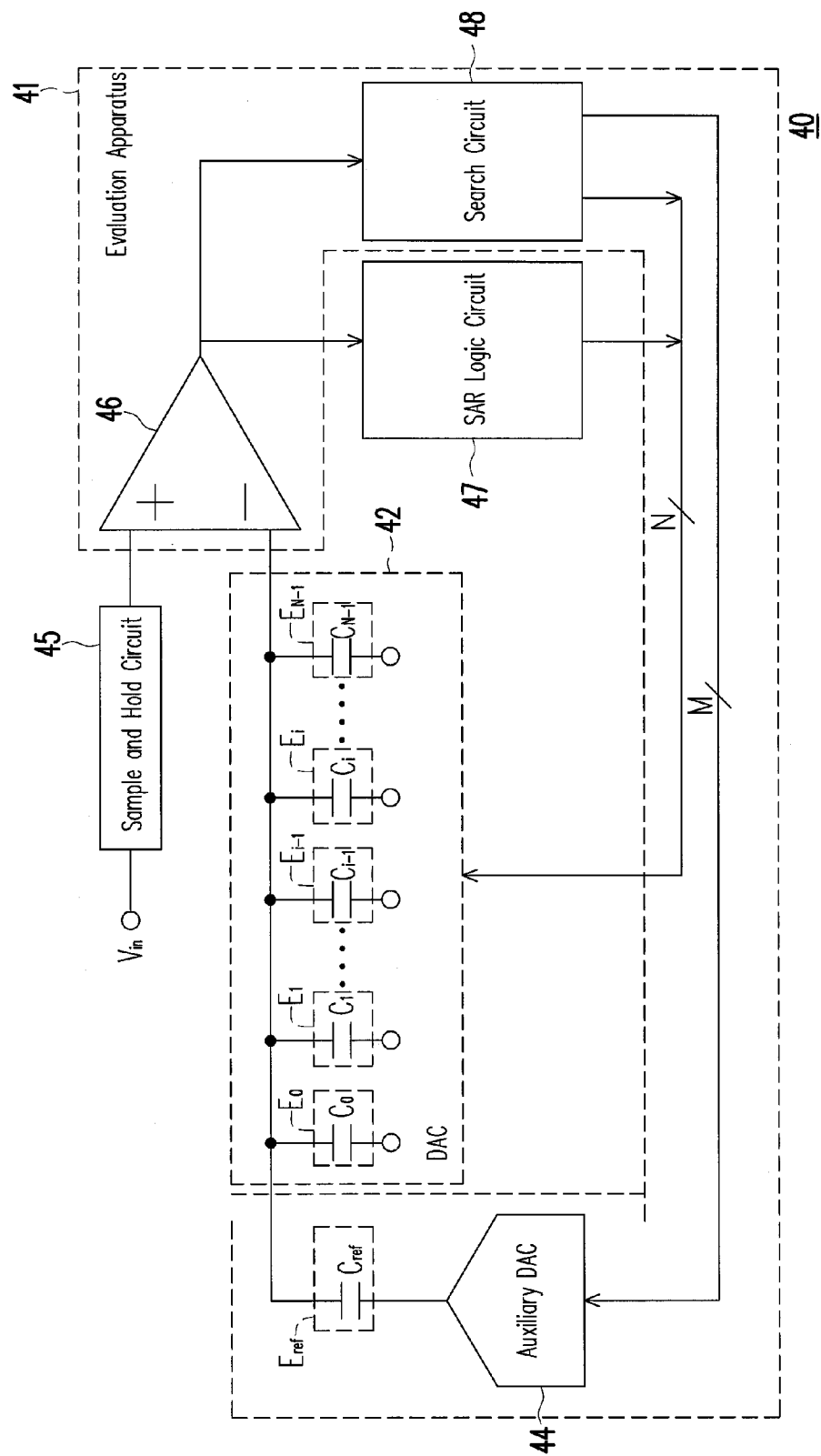
FIG. 4 is a block diagram of a SAR ADC according to an exemplary embodiment.

A SAR ADC is disclosed hereafter. As shown in FIG. 4, a block diagram of a SAR ADC according to an exemplary embodiment is illustrated in FIG. 4. Please refer to FIG. 4. A SAR ADC 40 includes an evaluation apparatus 41, a DAC 42, a sample and hold circuit 45, and a SAR logic circuit 47. The evaluation apparatus 41 includes a reference element $E_{ref}$, an auxiliary DAC 44, a comparator 46, and a search circuit 48.

The DAC 42 includes N composed elements represented by $E_0, E_1, \ldots, E_{N-1}$. The reference element $E_{ref}$ is coupled to the DAC 42, and the weighting values of the reference element $E_{ref}$ and the composed elements satisfy the following formulas:

$$W_{ref} > W_0, \text{ and} \quad (1)$$

$$\sum_{n=0}^{i-1} W_n + W_{ref} > W_i, \quad (2)$$

in which $W_{ref}$ is the weighting value of $E_{ref}$, $W_i$ is the weighting value of N is a positive integer greater than 1, and i and n are both positive integers greater than or equal to 0 and less than N.

Under the precondition that formulas (1) and (2) are satisfied, in some embodiments the weighting values of the composed elements may satisfy the formula:

$$W_n = \alpha^n * W_0,$$

in which a radix $\alpha$ is less than 2.

In a particular embodiment, the radix $\alpha$ may be 1.86.

In the present embodiment, the composed elements and the reference element are capacitors, for example. Therefore, the reference element $E_{ref}$ is a reference capacitor $C_{ref}$ having a first terminal and a second terminal, and the composed elements are N composed capacitors represented by $C_0$, $C_1$, $C_{N-1}$. Each of the composed capacitors has a first terminal and a second terminal, and all of the first terminals of the composed capacitors are coupled to a same node. The first terminal of the reference element $E_{ref}$ is coupled to the afore-described node, and the weighting values may be understood in this example as capacitances satisfying the following conditions:

$$C_{ref} > C_0, \text{ and} \quad (3)$$

$$\sum_{n=0}^{i-1} C_n + C_{ref} > C_i \quad (4)$$

Under the precondition that formulas (3) and (4) are satisfied, in some embodiments the composed capacitors may satisfy the formula:

$$C_n = \alpha^n * C_0,$$

in which the radix $\alpha$ is less than 2.

In a particular embodiment, the radix $\alpha$ may be 1.86. The present embodiment uses capacitors merely as an example, but the disclosure is not limited thereto. The composed elements and the reference element may be one of capacitors, resistors, and current sources, or other components which can be assembled into a DAC. When the composed elements are not capacitors, depending on the structure of the DAC, the circuits of the composed elements and the reference element do not necessarily have to have the first terminals connected together as depicted in the figure.

As described above, the DAC 42 in FIG. 4 is a capacitor array DAC having non-radix 2 capacitances. If an equivalent weighting of each of the composed elements in the capacitor array is known, that is, the capacitance of each of the composed capacitors or the ratio of the capacitance between each of the composed capacitors is known, then according to a successive approximation result, the SAR ADC performs a digital operation which can calculate a digital output value represented by the successive approximation result. Therefore, an emphasis is placed on finding a fast and accurate method to evaluate the equivalent weighting of each composed element.

Please continue reference to FIG. 4. The auxiliary DAC 44 has a M-bit digital input and an output coupled to the reference element $E_{ref}$, in which M is a positive integer greater than 1 The sample and hold circuit 45 is coupled to the comparator 46 and is adapted for sampling and holding an input voltage $V_{in}$. The comparator 46 has a first input terminal, a second input terminal, and an output terminal. The comparator 46 is adapted for comparing the inputs of the first input terminal and the second input terminal, and outputting a comparison result at the output terminal. The SAR logic circuit 47 is coupled to the comparator 46 and the DAC 42, and according to an output of the comparator 46, the SAR logic circuit 47 selects one of a first value $V_1$ and a second value $V_0$ as the input values of all of the composed elements $E_0, E_1, \ldots, E_{N-1}$, so as to obtain a corresponding digital value of the input voltage $V_{in}$. In the present embodiment, since the composed elements are the composed capacitors, the first value $V_1$ and the second value $V_0$ are respectively a voltage value VRT and a voltage value VRB, although the disclosure is not limited thereto. If the composed elements are current sources, then the first value $V_1$ and the second value $V_0$ may be control signals representing 1 and 0.

The search circuit 48 is coupled to the comparator 46, the auxiliary DAC 44, and the DAC 42. According to the output of the comparator 46, the search circuit 48 selects one of the first value $V_1$ and the second value. $V_0$ as the input values of the composed elements $E_0, E_1, \ldots, E_{N-1}$. Moreover, according to the output of the comparator 46, the search circuit 48 changes the binary values of the M-bit input of the auxiliary DAC 44, so as to adjust the input value of the reference element $E_{ref}$. According to the binary values of the M-bit input of the auxiliary DAC 44 and the input values of all the composed elements, the SAR ADC 40 or the evaluation apparatus 41 evaluates the weighting values of all the composed elements. The detailed steps of the evaluation process are described later.

Figure 5:
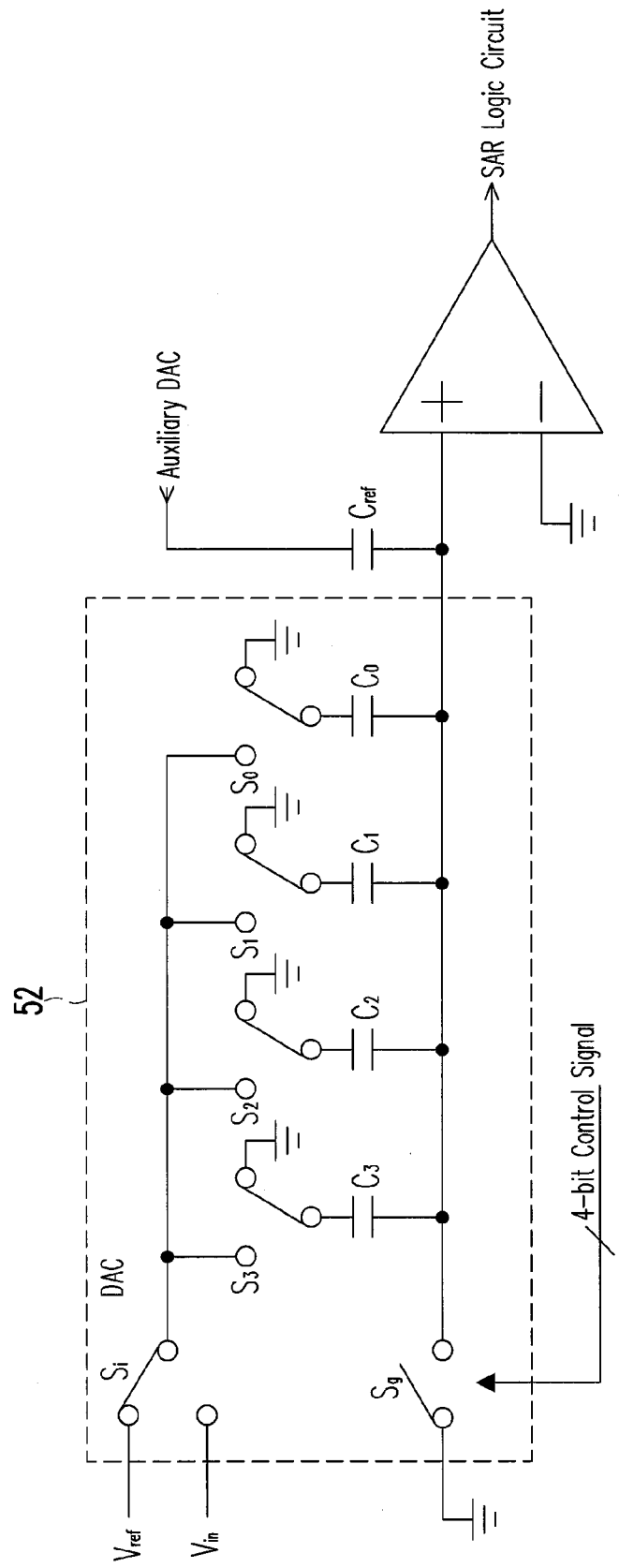
FIG. 5 is a simplified circuit diagram of a DAC in a SAR ADC according to an exemplary embodiment.

FIG. 5 is a simplified circuit diagram of a DAC in a SAR ADC according to an exemplary embodiment. Please refer to FIG. 5. A DAC 52 includes a plurality of switches and four composed capacitors represented by $C_0$, $C_1$, $C_2$, and $C_3$, and all of the first terminals of the composed capacitors are coupled to a same node. A first terminal of a reference capacitor $C_{ref}$ is also coupled to the afore-described node. Moreover, the sample and hold circuit can be omitted in the SAR ADC by jointly operating the switches $S_0$, $S_1$, $S_2$, $S_3$, $S_i$, and $S_g$. During the sampling phase, the switches $S_0$, $S_1$, $S_2$, and $S_3$ are switched to conduct to the switch $S_i$, and the switch $S_i$ is switched to conduct to the input voltage $V_{in}$. The switch $S_g$ is conducted so the capacitors $C_0, C_1, C_2$, and $C_3$ are charged to the input voltage $V_{in}$. During the conversion phase, the switch $S_g$ is switched to conduct to the reference voltage $V_{ref}$, the switch $S_g$ is broken off, and the switches $S_0, S_1, S_2$, and $S_3$ are switched according to a 4-bit control signal. After the successive approximation, when the voltage at the afore-described node approaches 0, that is, when the equivalent open circuit outputs of the two phases are approximately equal, the final ADC digital output value can be calculated and obtained according to the 4-bit control signal. By the same principles, all of the SAR ADCs in the present disclosure can omit the sample and hold circuit and achieve the comparison of two voltages, and therefore further elaboration is omitted hereafter. Moreover, all of the DACs in the SAR ADCs in the embodiments of the disclosure may be manufactured by the same principles, and the switches are not drawn to avoid confusion due to overly complex drawings.

Figure 6A:
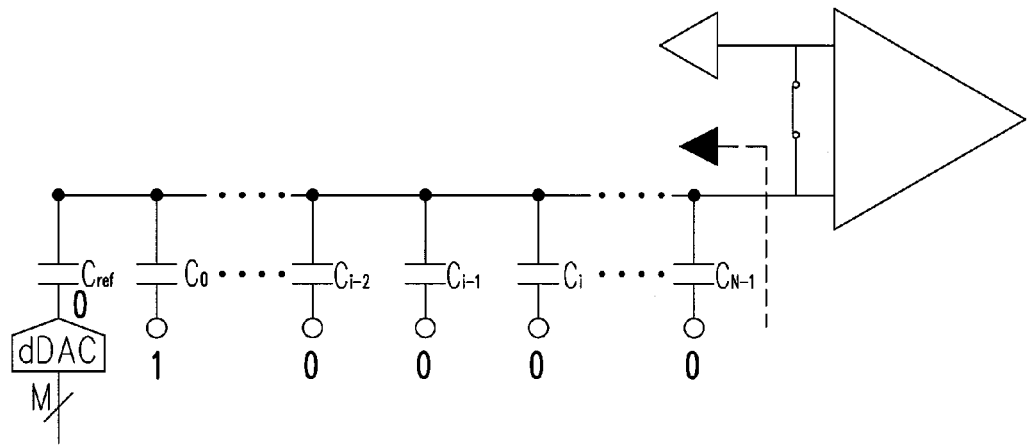
FIG. 6A is a simplified circuit diagram of a DAC and a comparator in a SAR ADC during a carrier sampling phase of an $0^{th}$ period according to an exemplary embodiment.
Figure 6B:
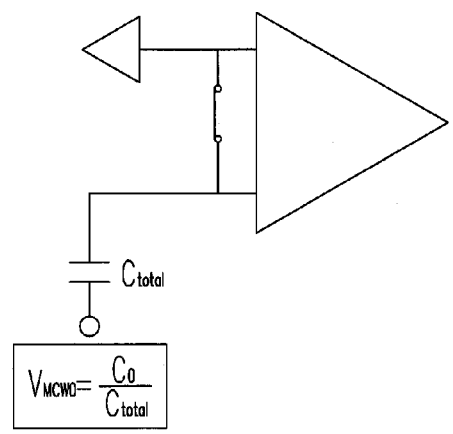
FIG. 6B is a Thenevin equivalent circuit diagram of the circuit depicted in FIG. 6A.
Figure 6C:
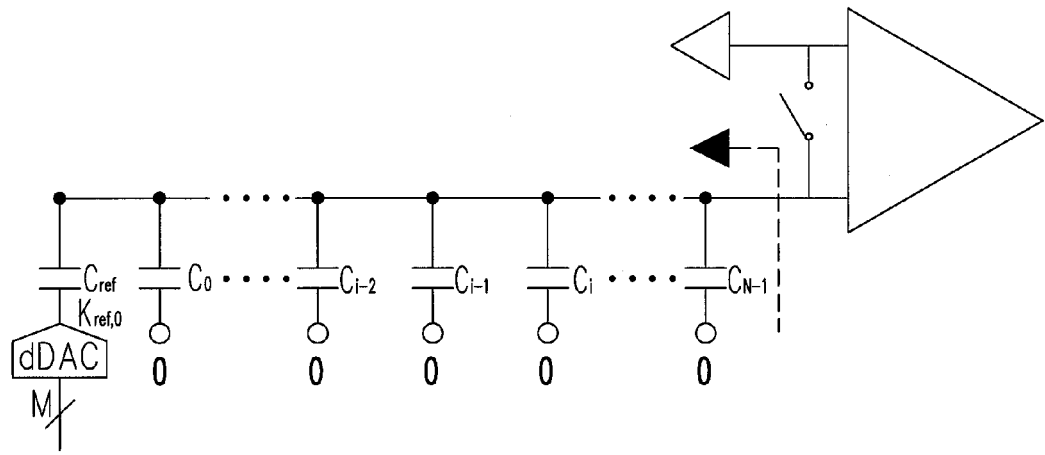
FIG. 6C is a simplified circuit diagram of a DAC and a comparator in a SAR ADC during a weighting evaluation phase of the $0^{th}$ period according to an exemplary embodiment.
Figure 6D:
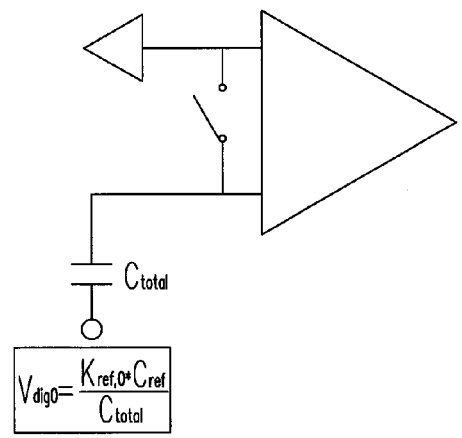
FIG. 6D is a Thenevin equivalent circuit diagram of the circuit depicted in FIG. 6C.
Figure 7A:
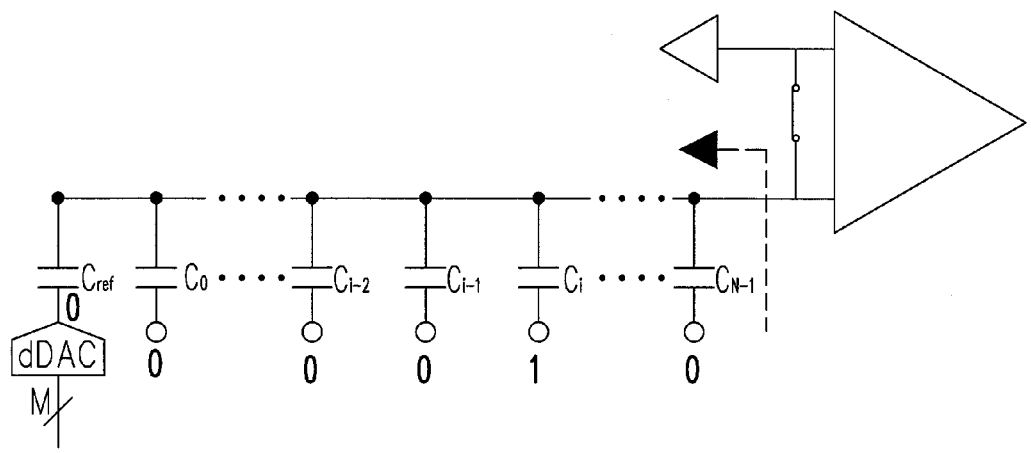
FIG. 7A is a simplified circuit diagram of a DAC and a comparator in a SAR ADC during a carrier sampling phase of an $i^{th}$ period according to an exemplary embodiment.
Figure 7B:
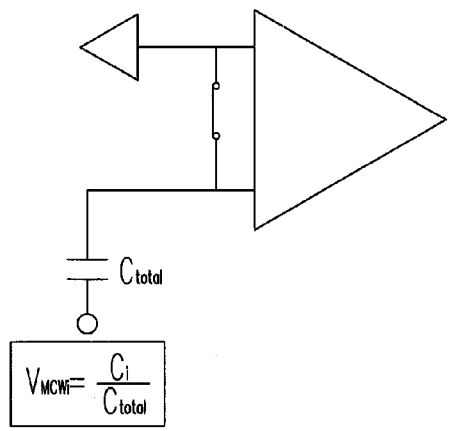
FIG. 7B is a Thenevin equivalent circuit diagram of the circuit depicted in FIG. 7A.
Figure 7C:
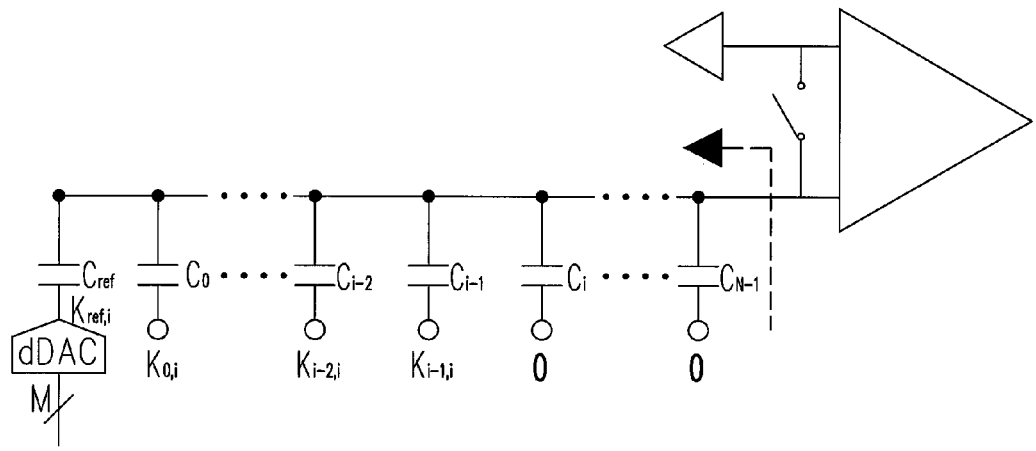
FIG. 7C is a simplified circuit diagram of a DAC and a comparator in a SAR ADC during a weighting evaluation phase of the $i^{th}$ period according to an exemplary embodiment.
Figure 7D:
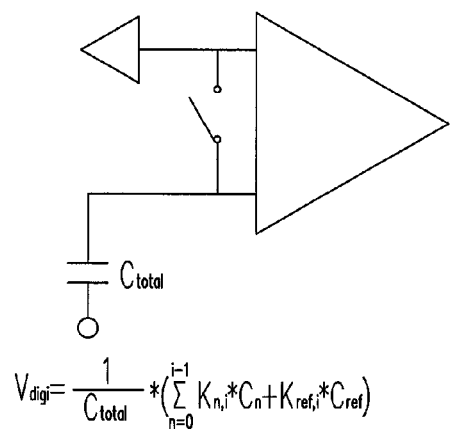
FIG. 7D is a Thenevin equivalent circuit diagram of the circuit depicted in FIG. 7C.

FIG. 6A is a simplified circuit diagram of a DAC and a comparator in a SAR ADC during a carrier sampling phase of an $0^{th}$ period according to an exemplary embodiment. FIG. 6B is a Thenevin equivalent circuit diagram of the circuit depicted in FIG. 6A. FIG. 6C is a simplified circuit diagram of a DAC and a comparator in a SAR ADC during a weighting evaluation phase of the $0^{th}$ period according to an exemplary embodiment. FIG. 6D is a Thenevin equivalent circuit diagram of the circuit depicted in FIG. 6C. FIG. 7A is a simplified circuit diagram of a DAC and a comparator in a SAR ADC during a carrier sampling phase of an $i^{th}$ period according to an exemplary embodiment. FIG. 7B is a Thenevin equivalent circuit diagram of the circuit depicted in FIG. 7A. FIG. 7C is a simplified circuit diagram of a DAC and a comparator in a SAR ADC during a weighting evaluation phase of the $i^{th}$ period according to an exemplary embodiment. FIG. 7D is a Thenevin equivalent circuit diagram of the circuit depicted in FIG. 7C.

Please refer to FIGS. 6A and 6B concurrently. As shown in FIG. 6A, during the carrier sampling phase of the $0^{th}$ period, the input of the capacitor $C_0$ is set to equal to the voltage value VRT representing input of 1. The inputs of the rest of the capacitors $C_1, C_{N-1}$ are set to equal to the voltage value VRB representing inputs of 0. Moreover, the binary values of the M-bit input of an auxiliary DAC dDAC are adjusted to 0, so as to adjust the input value at the second terminal of the reference capacitor $C_{ref}$ to equal the voltage value VRB representing input of 0. As shown in FIG. 6B, during the carrier sampling phase of the $0^{th}$ period, the equivalent open circuit output is set to $V_{MCW0}$.

Please refer to FIGS. 6C and 6D concurrently. As shown in FIG. 6C, during the weighting evaluation phase of the $0^{th}$ period, the inputs of the capacitors $C_0, C_1, \ldots, C_{N-1}$ are set to equal to the voltage value VRB representing inputs of 0. Moreover, by using a binary search method of the successive approximation, or a unary search method starting from a largest value or a smallest value, the binary values of the M-bit input of the auxiliary DAC dDAC are adjusted, so as to adjust the equivalent open circuit output $V_{dig0}$ to equal to $V_{MCW0}$. Moreover, according to the input value at the second terminal of the reference capacitor $C_{ref}$, that is the M-bit binary values, a rational multiple $K_{ref,0}$ less than 1 is obtained, in which:

$$C_0 = K_{ref,0} * C_{ref}$$

When the capacitance of the reference capacitor $C_{ref}$ is defined as 1, then the successive approximation result of the M-bit binary values is defined as the equivalent capacitance of the capacitor $C_0$. Moreover, this equivalent capacitance is the rational multiple $K_{ref,0}$ of the capacitance of the reference capacitor. The rational multiple $K_{ref,0}$ is defined by the M-bit binary values.

Therefore, in order for the capacitor $C_0$ to be defined by the reference capacitor $C_{ref}$, the aforementioned formula (3) must be satisfied:

$$C_{ref} > C_0 \quad (3)$$

This condition is easily satisfied in design. Even considering the issue of capacitance drift during a typical design, the condition can be satisfied without much waste with the reference capacitor $C_{ref}$. For example, values such as $C_{ref} = 1.2 * C_0$ is satisfactory.

Please refer to FIGS. 7A and 7B concurrently. As shown in FIG. 7A, during the carrier sampling phase of the $i^{th}$ period, the input of the capacitor $C_i$ is set to equal to the voltage value VRT representing input of 1. The inputs of the rest of the capacitors $C_0, \ldots, C_{i-1}, C_{i+1}, \ldots, C_{N-1}$ are set to equal to the voltage value VRB representing inputs of 0. Moreover, the binary values of the M-bit input of the auxiliary DAC dDAC are adjusted to 0, so as to adjust the input value at the second terminal of the reference capacitor $C_{ref}$ to equal the voltage value VRB representing input of 0. As shown in FIG. 7B, during the carrier sampling phase of the $i^{th}$ period, the equivalent open circuit output is set to $V_{MCWi}$.

Please refer to FIGS. 7C and 7D concurrently. As shown in FIG. 7C, during the weighting evaluation phase of the $i^{th}$ period, the inputs of the capacitors $C_i, C_{i+1}, \ldots, C_{N-1}$ labeled greater or equal to i are set to equal to the voltage value VRB representing inputs of 0. Moreover, by using the binary search method of the successive approximation, or a unary search method starting from the largest value or the smallest value, the binary values of the M-bit input of the auxiliary DAC dDAC are adjusted, and the input values of the capacitors $C_0, C_1, \ldots, C_{i-1}$ as one of the voltage value VRT representing inputs of 1 and the voltage value VRB representing inputs of 0, so the equivalent open circuit output $V_{digi}$ is approximately equal to $V_{MCWi}$. Moreover, according to the input value at the second terminal of the reference capacitor $C_{ref}$ (or the M-bit binary values) and the input values at the second terminal of the capacitors $C_0, C_1, \ldots, C_{i-1}$, the coefficients $K_0, K_{1,i}, \ldots, K_{i-1,i}$ and the rational multiple $K_{ref,i}$ less than 1 are obtained, in which:

$$K_{0,i}, K_{1,i}, \ldots K_{i-1,i} \in \{0, 1\}, \text{ and}$$

$$C_i = \sum_{n=0}^{i-1} K_{n,i} * C_n + K_{ref,i} * C_{ref}$$

When the capacitance of the reference capacitor $C_{ref}$ is defined as 1, and since the equivalent capacitances of the capacitors $C_{i-1}, C_{i-2}, \ldots, C_1, C_0$ are known and represented as the rational multiple of the capacitance of the reference capacitor $C_{ref}$, the equivalent capacitance of the capacitor $C_i$ may be calculated and represented as the rational multiple of the capacitance of the reference capacitor $C_{ref}$.

In other words, after obtaining the equivalent capacitance of the capacitor $C_0$, by employing the capacitors $C_0$ and $C_{ref}$ and the auxiliary DAC dDAC, and utilizing the search result of the binary search method of the successive approximation or the unary search method starting from the largest value or the smallest value, the equivalent capacitance of the capacitor $C_1$ can be obtained. Moreover, since the equivalent capacitance of the capacitor $C_0$ is known to be the rational multiple of the capacitance of the reference capacitor, the equivalent weighting of the capacitor $C_1$ can also be represented as the rational multiple of the capacitance of the reference capacitor. Likewise, by employing the capacitors $C_1, C_0$, and $C_{ref}$ and the auxiliary DAC dDAC, and utilizing the search result of the binary search method of the successive approximation or the unary search method starting from the largest value or the smallest value, the equivalent capacitance of the capacitor $C_2$ can be obtained. Moreover, since the equivalent capacitances of the capacitors $C_1$ and $C_0$ are known to be the rational multiples of the capacitance of the reference capacitor, the equivalent weighting of the capacitor $C_2$ can also be represented as the rational multiple of the capacitance of the reference capacitor. Similarly, all of the capacitances of the composed capacitors can be represented as the rational multiples of the capacitance of the reference capacitor.

Therefore, in order for the capacitor $C_i$ to be defined by the capacitors $C_{i-1}, C_{i-2}, \ldots, C_1, C_0$, and $C_{ref}$, the aforementioned formula (4) must be satisfied:

$$\sum_{n=0}^{i-1} C_n + C_{ref} > C_i \quad (4)$$

For example, a DAC composed of a sub-radix-2 capacitor array with the addition of the afore-described value for $C_{ref}$ can satisfy the above condition.

The afore-described successive approximation is a binary search method, and the other unary search method is a search method starting from the largest/smallest value and monotonically searching down/up. However, the disclosure is not limited by the afore-described examples.

Figure 8:
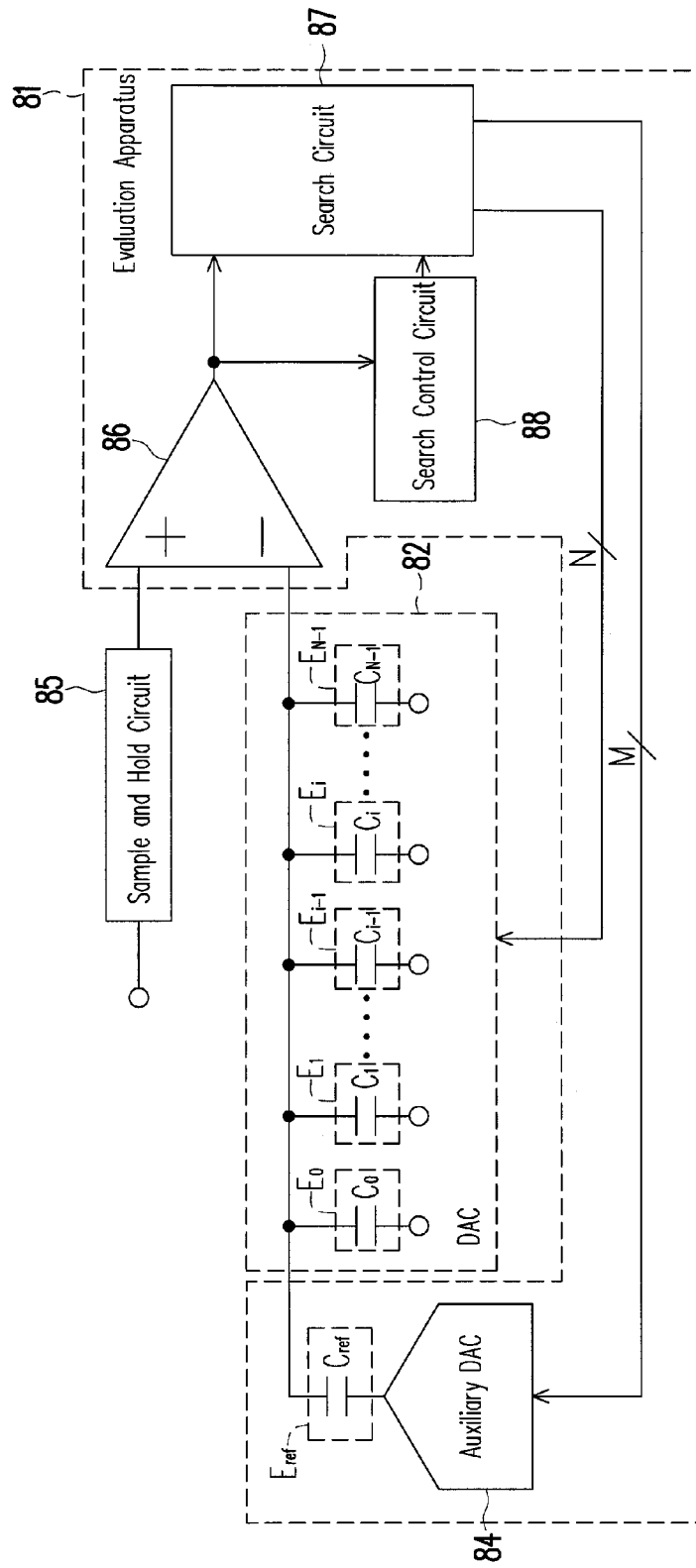
FIG. 8 is a block diagram of a SAR ADC according to an exemplary embodiment.

Another SAR ADC is disclosed hereafter. As shown in FIG. 8, a block diagram of a SAR ADC according to an exemplary embodiment is illustrated in FIG. 8. Please refer to FIG. 8. A SAR ADC 80 includes an evaluation apparatus 81, a DAC 82, and a sample and hold circuit 85. The evaluation apparatus 81 includes a reference element $E_{ref}$, an auxiliary DAC 84, a comparator 86, a SAR logic circuit 87, and a search control circuit 88. Besides the SAR logic circuit 87 and the search control circuit 88, other components in the present embodiment are similar to the embodiment depicted in FIG. 4, therefore further elaboration thereof is omitted.

A difference from the embodiment depicted in FIG. 4 is that, in the present embodiment, besides being coupled to the comparator 86 and the DAC 82, the SAR logic circuit 87 is also coupled to the auxiliary DAC 84. Therefore, the SAR logic circuit 87 controls both the DAC 82 and the auxiliary DAC 84. The search control circuit 88 is coupled to the SAR logic circuit 87, and the search control circuit 88 controls the SAR logic circuit 87 to select one of the first value $V_1$ and the second value $V_0$ as the input values of all of the composed elements $E_0, E_1, \ldots, E_{N-1}$ according to an output of the comparator 86. Moreover, according to the output of the comparator 86, the binary values of the M-bit input of the auxiliary DAC 84 are changed, so as to adjust the input value of the reference element $E_{ref}$. According to the binary values of the M-bit input of the auxiliary DAC 84 and the input values of all the composed elements, the SAR ADC 80 or the evaluation apparatus 81 evaluates the weighting values of all the composed elements.

Figure 9:
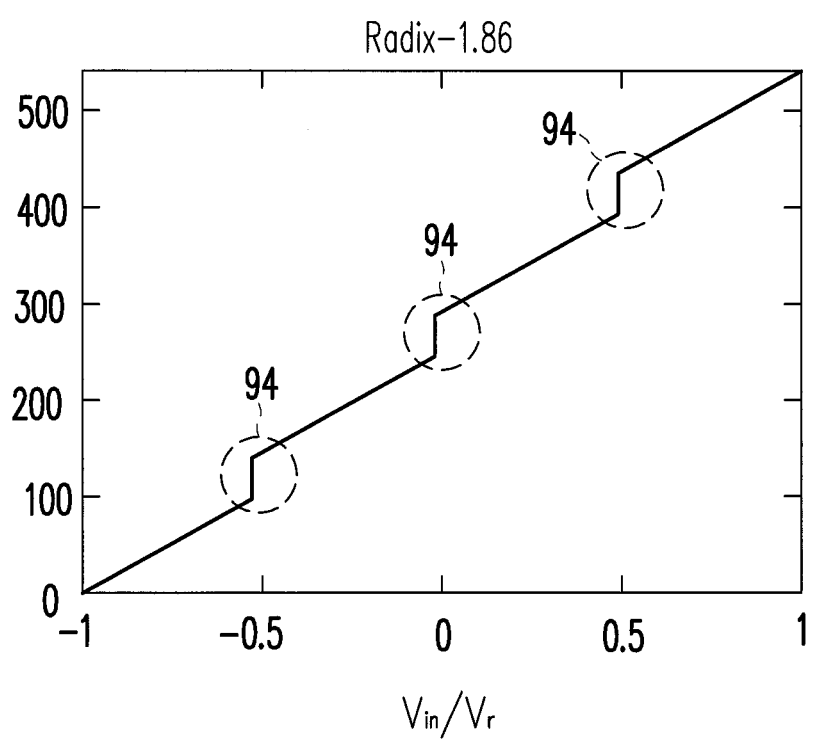
FIG. 9 is a diagram illustrating a typical conversion function of a SAR ADC according to an exemplary embodiment.

FIG. 9 is a diagram illustrating a typical conversion function of a SAR ADC according to an exemplary embodiment. Please refer to FIG. 9. The capacitor array of the DAC in the SAR ADC uses a capacitance of radix 1.86, that is:

$$C_n = \alpha^n * C_0,$$

in which the radix $\alpha$ is 1.86.

As shown in FIG. 9, only the missing code condition represented by a circular dotted line 94 occurs, and the missing decision level condition does not occur. Therefore, a linear conversion curve can be fully obtained by digital compensation.

Figure 10:
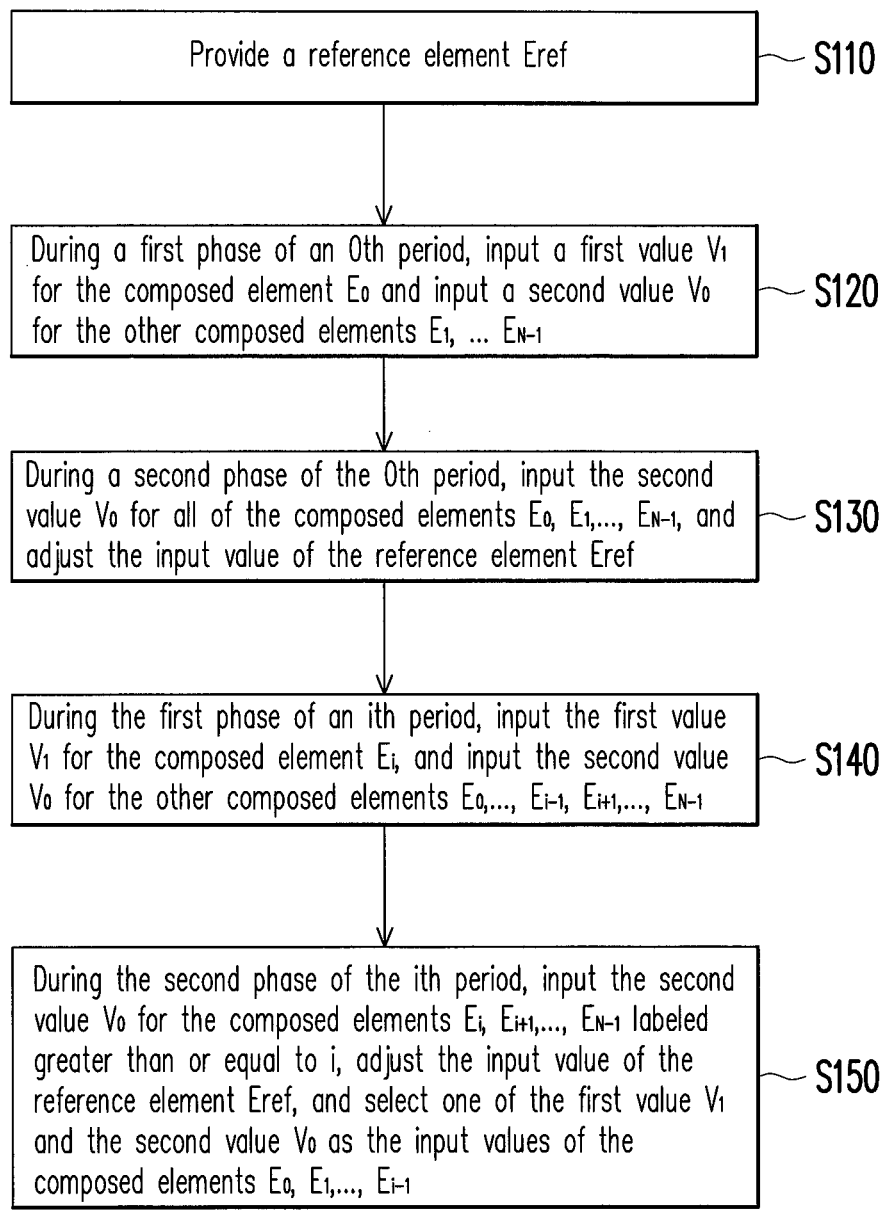
FIG. 10 is a flow chart of a method for evaluating weighting of elements of a DAC.

On the other hand, if the composed capacitors and the reference capacitor in the above examples are the composed elements and the reference element, then a method for evaluating weighting of elements of a DAC can be obtained. The DAC includes N composed elements represented by $E_0, E_1, \ldots, E_{N-1}$. FIG. 10 is a flow chart of a method for evaluating weighting of elements of a DAC. Please refer to FIG. 10.

In a Step S110, a reference element $E_{ref}$ is provided. The reference element $E_{ref}$ is coupled to the DAC, and the weighting values of the reference element $E_{ref}$ and the composed elements satisfy the following formulas:

$$W_{ref} > W_0, \text{ and}$$

$$\sum_{n=0}^{i-1} W_n + W_{ref} > W_i,$$

in which $W_{ref}$ is the weighting value of $E_{ref}$, $W_i$ is the weighting value of $E_i$, N is a positive integer greater than 1, and i and n are both positive integers greater than or equal to 0 and less than N.

In a Step S120, during a first phase of an $0^{th}$ period, for example during a carrier sampling phase, a first value $V_1$ is inputted for the composed element $E_0$ and a second value $V_0$ is inputted for the other composed elements $E_1, \ldots, E_{N-1}$, so an equivalent open circuit output is $V_{MCW0}$.

In a Step S130, during a second phase of the $0^{th}$ period, for example a weighting evaluation phase, the second value $V_0$ is inputted for all of the composed elements $E_0, E_1, \ldots, E_{N-1}$, and the input value of the reference element $E_{ref}$ is adjusted, so the equivalent open circuit output $V_{dig0}$ is approximately equal to $V_{MCW0}$. Moreover, according to the input value of the reference element $E_{ref}$, a rational multiple $K_{ref,0}$ less than 1 is obtained, in which:

$$W_0 = K_{ref,0} * W_{ref}$$

In a Step S140, during the first phase of an $i^{th}$ period, the first value $V_1$ is inputted for the composed element $E_i$, and the second value $V_0$ is inputted for the other composed elements $E_0, \ldots, E_{i-1}, E_{i+1}, \ldots, E_{N-1}$, so the equivalent open circuit output is $V_{MCWi}$. In a Step S150, during the second phase of the $i^{th}$ period, the second value $V_0$ is inputted for the composed elements $E_i, E_{i+1}, \ldots, E_{N-1}$ labeled greater than or equal to i, the input value of the reference element $E_{ref}$ is adjusted, and one of the first value $V_1$ and the second value $V_0$ is selected as the input values of the composed elements $E_0, E_1, \ldots, E_{i-1}$, so the equivalent open circuit output $V_{digi}$ is approximately equal to $V_{MCWi}$. Moreover, according to the input value of the reference element $E_{ref}$ and the input values of the composed elements $E_0, E_1, \ldots, E_{i-1}$, the coefficients $K_{0,i}, K_{1,i}, \ldots K_{i-1,i}$, and a rational multiple $K_{ref,i}$ less than 1 are obtained, in which:

$$K_{0,i}, K_{1,i}, \ldots K_{i-1,i} \in \{0, 1\}, \text{ and}$$

$$W_i = \sum_{n=0}^{i-1} K_{n,i} * W_n + K_{ref,i} * W_{ref}$$

By repeating steps S140 and S150, where i is successively increased from 1 until N−1, the weighting values of all of the composed elements can be obtained, and these weighting values can all be represented as rational multiples of the weighting value of the reference element. Although the embodiments used the aforementioned formulas as an example, the disclosure is not limited thereto. In practice, the weighting value of the composed element $E_0$ can be evaluated according to the rational multiple $K_{ref,0}$, and the weighting value of the composed element $E_i$ can be evaluated according to the coefficients $K_{0,i}, K_{1,i}, \ldots, K_{i-1,1}$ and the rational multiple $K_{ref,i}$.

By using the calibration methods set forth in the disclosure and by calibrating each composed element of the DAC in the SAR ADC, the equivalent weighting of each composed element in the DAC can all be different. Accordingly, the necessity of matching among the composed elements in the DAC can be prevented. Moreover, by adding a reference element having a reference weighting and an auxiliary DAC connected to the reference element, the equivalent weighting of each composed element can be successively calibrated from the least-significant bit (LSB) to the most-significant bit (MSB), and thereby obtain each equivalent weighting represented by the reference weighting. The ADC can calculate and then obtain the digital output value of the ADC by using each calibrated equivalent weighting and the successive approximation result of each input signal, so the transfer function between the analog input signal and the digital output value of the ADC has a linear relationship.

In the disclosure, the necessity of matching among the composed elements of the DAC in a SAR ADC is eliminated.

Accordingly, the overall area and power consumption of the SAR ADC is reduced, and the driving capability requirement of the DAC driving circuit is lowered (the driving circuit may be a front-stage driving circuit or a reference voltage driving circuit according to different configurations of the DAC). In a system application which requires an ADC array, such as an analog front-end of a image sensor parallel process, or an analog front-end of a ultrasonic imaging system, for example, intellectual property involving a low power, small area ADC aids the integration of circuits. In other words, more front-end channels can be integrated on a single chip, thereby reducing system costs and helping the development of portable systems.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method for evaluating weighting of elements of a digital-to-analog converter (DAC), the DAC comprising N composed elements represented by $E_0, E_1, \ldots, E_{N-1}$, the method comprising:

providing a reference element $E_{ref}$ coupled to the DAC;

during a first phase of an $0^{th}$ period, inputting a first value $V_1$ for the composed element $E_0$ and inputting a second value $V_0$ for the other composed elements $E_1, \ldots, E_{N-1}$, so an equivalent open circuit output is $V_{MCW0}$;

during a second phase of the $0^{th}$ period, inputting the second value $V_0$ for all of the composed elements $E_0, E_1, \ldots, E_{N-1}$, and adjusting the input value of the reference element $E_{ref}$, so the equivalent open circuit output $V_{dig0}$ is approximately equal to $V_{MCW0}$, and according to the input value of the reference element $E_{ref}$, obtaining a rational multiple $K_{ref,0}$ less than 1, wherein a weighting value of the composed element $E_0$ is evaluated according to the rational multiple $K_{ref,0}$;

during the first phase of an $i^{th}$ period, inputting the first value $V_1$ for the composed element $E_i$, and inputting the second value $V_0$ for the other composed elements $E_0, \ldots, E_{i-1}, E_{i+1}, \ldots, E_{N-1}$, so the equivalent open circuit output is $V_{MCWi}$; and during the second phase of the $i^{th}$ period, inputting the second value $V_0$ for the composed elements $E_i$, $E_{i+1}, \ldots, E_{N-1}$ labeled greater than or equal to i, adjusting the input value of the reference element $E_{ref}$, and selecting one of the first value $V_1$ and the second value $V_0$ as the input values of the composed elements $E_0, E_1, \ldots, E_{i-1}$, so the equivalent open circuit output $V_{digi}$ is approximately equal to $V_{MCWi}$, and according to the input value of the reference element $E_{ref}$ and the input values of the composed elements $E_0, E_1, \ldots, E_{i-1}$, obtaining the coefficients $K_{0,i}, K_{1,i}, \ldots, K_{i-1,i}$ and a rational multiple $K_{ref,i}$ less than 1, wherein a weighting value of the composed element $E_i$ is evaluated according to the coefficients $K_{0,i}, K_{1,i}, \ldots, K_{i-1,i}$ and the rational multiple $K_{ref,i}$, N is a positive integer greater than 1, and i is a positive integer greater or equal to 0 and less than N.

2. The method for evaluating weighting of elements of the DAC as claimed in claim 1, wherein the weighting values of the reference element $E_{ref}$ and the composed elements satisfy:

$$W_{ref} > W_0, \text{ and}$$

$$\sum_{n=0}^{i-1} W_n + W_{ref} > W_i,$$

wherein $W_{ref}$ is the weighting value of the reference element $E_{ref}$, $W_i$ is the weighting value of the composed element $E_i$, n is a positive integer greater than or equal to 0 and less than N, and the weighting value of the composed element $E_0$ is:

$$W_0 = K_{ref,0} * W_{ref},$$

and the weighting value of the composed element $E_i$ is:

$$K_{0,i}, K_{1,i}, \ldots K_{i-1,i} \in \{0, 1\},$$

$$W_i = \sum_{n=0}^{i-1} K_{n,i} * W_n + K_{ref,i} * W_{ref}.$$

3. The method for evaluating weighting of elements of the DAC as claimed in claim 2, further comprising:

providing a M-bit auxiliary DAC, an output of the auxiliary DAC is coupled to the reference element $E_{ref}$, when the input value of the reference element $E_{ref}$ is adjusted, the binary values of a M-bit input of the auxiliary DAC are changed, wherein M is a positive integer greater than 1.

4. The method for evaluating weighting of elements of the DAC as claimed in claim 2, wherein the weighting values of the composed elements satisfy:

$$W_n = \alpha^n * W_0,$$

wherein a radix $\alpha$ is less than 2.

5. The method for evaluating weighting of elements of the DAC as claimed in claim 4, wherein the radix $\alpha$ is 1.86.

6. The method for evaluating weighting of elements of the DAC as claimed in claim 2, wherein the composed elements and the reference element are one of capacitors, resistors, and current sources.

7. An evaluation apparatus for evaluating weighting of elements of a DAC, the DAC comprising N composed elements represented by $E_0, E_1, \ldots, E_{N-1}$, the evaluation apparatus comprising:

a reference element $E_{ref}$ coupled to the DAC, and the weighting values of the reference element $E_{ref}$ and the composed elements satisfy:

$$W_{ref} > W_0, \text{ and}$$

$$\sum_{n=0}^{i-1} W_n + W_{ref} > W_i,$$

wherein $W_{ref}$ is the weighting value of the reference element $E_{ref}$, $W_i$ is the weighting value of the composed element $E_i$, N is a positive integer greater than 1, i and n are positive integers greater than or equal to 0 and less than N;

an auxiliary DAC; having a M-bit digital input, and an output of the auxiliary DAC is coupled to the reference element $E_{ref}$, wherein M is a positive integer greater than 1;

a comparator having a first input terminal, a second input terminal, and an output terminal, adapted for comparing the inputs of the first input terminal and the second input terminal, and outputting a comparison result at the output terminal; and a search circuit coupled to the comparator, the auxiliary DAC, and the DAC, the search circuit selecting one of a first value $V_1$ and a second value $V_0$ as the input values of all of the composed elements $E_0, E_1, \ldots, E_{N-1}$ according to an output of the comparator, and according to the output of the comparator, the search circuit changes the binary values of the M-bit input of the auxiliary DAC, so as to adjust the input value of the reference element $E_{ref}$, and according to the binary values of the M-bit input of the auxiliary DAC and the input values of all the composed elements, the evaluation apparatus evaluates the weighting values of all the composed elements.

8. The evaluation apparatus for evaluating weighting of elements of the DAC as claimed in claim 7, wherein:

during a first phase of an $0^{th}$ period, inputting the first value $V_1$ for the composed element $E_0$ and inputting the second value $V_0$ for the other composed elements $E_1, \ldots, E_{N-1}$, so an equivalent open circuit output is $V_{MCW0}$;

during a second phase of the $0^{th}$ period, inputting the second value $V_0$ for all of the composed elements $E_0, E_1, \ldots, E_{N-1}$, and adjusting the input value of the reference element $E_{ref}$, so the equivalent open circuit output $V_{dig0}$ is approximately equal to $V_{MCW0}$, and according to the input value of the reference element $E_{ref}$, obtaining a rational multiple $K_{ref,0}$ less than 1, wherein, $$W_0 = K_{ref,0} * W_{ref};$$

during the first phase of an $i^{th}$ period, inputting the first value $V_1$ for the composed element $E_i$, and inputting the second value $V_0$ for the other composed elements $E_0, \ldots, E_{i-1}, E_{i+1}, \ldots, E_{N-1}$, so the equivalent open circuit output is $V_{MCWi}$; and during the second phase of the $i^{th}$ period, inputting the second value $V_0$ for the composed elements $E_i, E_{i+1}, \ldots, E_{N-1}$ labeled greater than or equal to i, adjusting the input value of the reference element $E_{ref}$, and selecting one of the first value $V_1$ and the second value $V_0$ as the input values of the composed elements $E_0, E_1, \ldots, E_{i-1}$, so the equivalent open circuit output $V_{digi}$ is approximately equal to $V_{MCWi}$, and according to the input value of the reference element $E_{ref}$ and the input values of the composed elements $E_0, E_1, \ldots, E_{i-1}$, obtaining the coefficients $K_{0,i}, K_{1,i}, \ldots, K_{i-1,i}$ and a rational multiple $K_{ref,i}$ less than 1, wherein, $$K_{0,i}, K_{1,i}, \ldots K_{i-1,i} \in \{0, 1\}, \text{ and}$$

$$W_i = \sum_{n=0}^{i-1} K_{n,i} * W_n + K_{ref,i} * W_{ref}.$$

9. The evaluation apparatus for evaluating weighting of elements of the DAC as claimed in claim 7, wherein the weighting values of the composed elements satisfy:

$$W_n = \alpha^n * W_0,$$

wherein a radix $\alpha$ is less than 2.

10. The evaluation apparatus for evaluating weighting of elements of the DAC as claimed in claim 9, wherein the radix $\alpha$ is 1.86.

11. The evaluation apparatus for evaluating weighting of elements of the DAC as claimed in claim 7, wherein the composed elements and the reference element are one of capacitors, resistors, and current sources.

12. An evaluation apparatus for evaluating weighting of elements of a DAC, the DAC comprising N composed elements represented by $E_0, E_1, \ldots, E_{N-1}$, the evaluation apparatus comprising:

a reference element $E_{ref}$ coupled to the DAC, and the weighting values of the reference element $E_{ref}$ and the composed elements satisfy:

$$W_{ref} > W_0, \text{ and}$$

$$\sum_{n=0}^{i-1} W_n + W_{ref} > W_i,$$

wherein $W_{ref}$ is the weighting value of the reference element $E_{ref}$, $W_i$ is the weighting value of the composed element $E_i$, N is a positive integer greater than 1, i and n are positive integers greater than or equal to 0 and less than N;

an auxiliary DAC having a M-bit digital input, and an output of the auxiliary DAC is coupled to the reference element $E_{ref}$, wherein M is a positive integer greater than 1;

a comparator having a first input terminal, a second input terminal, and an output terminal, adapted for comparing the inputs of the first input terminal and the second input terminal, and outputting a comparison result at the output terminal;

a successive-approximated register (SAR) logic circuit coupled to the comparator, the auxiliary DAC, and the DAC; and a search control circuit coupled to the SAR logic circuit, the search control circuit controlling the SAR logic circuit to select one of a first value $V_1$ and a second value $V_0$ as the input values of all of the composed elements $E_0, E_1, \ldots, E_{N-1}$ according to an output of the comparator, and according to the output of the comparator, changing the binary values of the M-bit input of the auxiliary DAC, so as to adjust the input value of the reference element $E_{ref}$, and according to the binary values of the M-bit input of the auxiliary DAC and the input values of all the composed elements, the evaluation apparatus evaluates the weighting values of all the composed elements.

13. The evaluation apparatus for evaluating weighting of elements of the DAC as claimed in claim 12, wherein:

during a first phase of an $0^{th}$ period, inputting the first value $V_1$ for the composed element $E_0$ and inputting the second value $V_0$ for the other composed elements $E_1, \ldots, E_{N-1}$, so an equivalent open circuit output is $V_{MCW0}$;

during a second phase of the $0^{th}$ period, inputting the second value $V_0$ for all of the composed elements $E_0, E_1, \ldots, E_{N-1}$, and adjusting the input value of the reference element $E_{ref}$, so the equivalent open circuit output $V_{dig0}$ is approximately equal to $V_{MCW0}$, and according to the input value of the reference element $E_{ref}$, obtaining a rational multiple $K_{ref,0}$ less than 1, wherein, $$W_0 = K_{ref,0} * W_{ref};$$

during the first phase of an $i^{th}$ period, inputting the first value $V_1$ for the composed element $E_i$, and inputting the second value $V_0$ for the other composed elements $E_0, \ldots, E_{i-1}, E_{i+1}, \ldots, E_{N-1}$, so the equivalent open circuit output is $V_{MCWi}$; and during the second phase of the $i^{th}$ period, inputting the second value $V_0$ for the composed elements $E_i$, $E_{i+1}, \ldots, E_{N-1}$ labeled greater than or equal to i, adjusting the input value of the reference element $E_{ref}$, and selecting one of the first value $V_1$ and the second value $V_0$ as the input values of the composed elements $E_0, E_1, \ldots, E_{i-1}$, so the equivalent open circuit output $V_{digi}$ is approximately equal to $V_{MCWi}$, and according to the input value of the reference element $E_{ref}$ and the input values of the composed elements $E_0, E_1, \ldots, E_{i-1}$, obtaining the coefficients $K_{0,i}, K_{1,i}, K_{i-1,i}$ and a rational multiple $K_{ref,i}$ less than 1, wherein, $$K_{0,i}, K_{1,i}, \ldots K_{i-1,i} \in \{0, 1\}, \text{ and}$$

$$W_i = \sum_{n=0}^{i-1} K_{n,i} * W_n + K_{ref,i} * W_{ref}.$$

14. The evaluation apparatus for evaluating weighting of elements of the DAC as claimed in claim 12, wherein the weighting values of the composed elements satisfy:

$$W_n = \alpha^n * W_0,$$

wherein a radix $\alpha$ is less than 2.

15. The evaluation apparatus for evaluating weighting of elements of the DAC as claimed in claim 14, wherein the radix $\alpha$ is 1.86.

16. The evaluation apparatus for evaluating weighting of elements of the DAC as claimed in claim 12, wherein the composed elements and the reference element are one of capacitors, resistors, and current sources.

17. A successive-approximated register analog-to-digital converter (SAR ADC), comprising:

a DAC comprising N composed elements represented by $E_0, E_1, \ldots, E_{N-1}$;

a reference element $E_{ref}$ coupled to the DAC, and the weighting values of the reference element $E_{ref}$ and the composed elements satisfy:

$$W_{ref} > W_0, \text{ and}$$

$$\sum_{n=0}^{i-1} W_n + W_{ref} > W_i,$$

wherein $W_{ref}$ is the weighting value of the reference element $E_{ref}$, $W_i$ is the weighting value of the composed element $E_i$, N is a positive integer greater than 1, i and n are positive integers greater than or equal to 0 and less than N;

an auxiliary DAC having a M-bit digital input, and an output of the auxiliary DAC is coupled to the reference element $E_{ref}$, wherein M is a positive integer greater than 1;

a comparator having a first input terminal, a second input terminal, and an output terminal, adapted for comparing the inputs of the first input terminal and the second input terminal, and outputting a comparison result at the output terminal;

a SAR logic circuit coupled to the comparator and the DAC, adapted for selecting one of a first value $V_1$ and a second value $V_0$ as the input values of all of the composed elements $E_0, E_1, \ldots, E_{N-1}$ according to an output of the comparator, so as to obtain a corresponding digital value of an input voltage; and a search circuit coupled to the comparator, the auxiliary DAC, and the DAC, the search circuit selecting one of the first value $V_1$ and the second value $V_0$ as the input values of the composed elements $E_0, E_1, \ldots, E_{N-1}$ according to the output of the comparator, and according to the output of the comparator, the search circuit changes the binary values of the M-bit input of the auxiliary DAC, so as to adjust the input value of the reference element $E_{ref}$, and according to the binary values of the M-bit input of the auxiliary DAC and the input values of all the composed elements, the SAR ADC evaluates the weighting values of all the composed elements.

18. The SAR ADC as claimed in claim 17, wherein:

during a first phase of an $0^{th}$ period, inputting the first value $V_1$ for the composed element $E_0$ and inputting the second value $V_0$ for the other composed elements $E_1, \ldots, E_{N-1}$, so an equivalent open circuit output is $V_{MCW0}$;

during a second phase of the $0^{th}$ period, inputting the second value $V_0$ for all of the composed elements $E_0, E_1, \ldots, E_{N-1}$, and adjusting the input value of the reference element $E_{ref}$, so the equivalent open circuit output $V_{dig0}$ is approximately equal to $V_{MCW0}$, and according to the input value of the reference element $E_{ref}$, obtaining a rational multiple $K_{ref,0}$ less than 1, wherein, $$W_0 = K_{ref,0} * W_{ref};$$

during the first phase of an $i^{th}$ period, inputting the first value $V_1$ for the composed element $E_i$, and inputting the second value $V_0$ for the other composed elements $E_0, \ldots, E_{i-1}, E_{i+1}, \ldots, E_{N-1}$, so the equivalent open circuit output is $V_{MCWi}$; and during the second phase of the $i^{th}$ period, inputting the second value $V_0$ for the composed elements $E_i$, $E_{i+1}, \ldots, E_{N-1}$ labeled greater than or equal to i, adjusting the input value of the reference element $E_{ref}$, and selecting one of the first value $V_1$ and the second value $V_0$ as the input values of the composed elements $E_0, E_1, \ldots, E_{i-1}$, so the equivalent open circuit output $V_{digi}$ is approximately equal to $V_{MCWi}$, and according to the input value of the reference element $E_{ref}$ and the input values of the composed elements $E_0, E_1, \ldots, E_{i-1}$, obtaining the coefficients $K_{0,i}, K_{1,i}, \ldots, K_{i-1,i}$ and a rational multiple $K_{ref,i}$ less than 1, wherein, $$K_{0,i}, K_{1,i}, \ldots K_{i-1,i} \in \{0, 1\}, \text{ and}$$

$$W_i = \sum_{n=0}^{i-1} K_{n,i} * W_n + K_{ref,i} * W_{ref}.$$

19. The SAR ADC as claimed in claim 17, wherein the weighting values of the composed elements satisfy:

$$W_n = \alpha^n * W_0,$$

wherein a radix $\alpha$ is less than 2.

20. The SAR ADC as claimed in claim 19, wherein the radix $\alpha$ is 1.86.

21. The SAR ARC as claimed in claim 17, wherein the composed elements and the reference element are one of capacitors, resistors, and current sources.

22. The SAR ADC as claimed in claim 17, further comprising:

a sample and hold circuit coupled to the comparator, adapted for sampling and holding the input voltage.

23. A SAR ADC, comprising:
- a DAC comprising N composed elements represented by $E_0, E_1, \ldots, E_{N-1}$;
- a reference element $E_{ref}$ coupled to the DAC, and the weighting values of the reference element $E_{ref}$ and the composed elements satisfy:

$$W_{ref} > W_0, \text{ and}$$

$$\sum_{n=0}^{i-1} W_n + W_{ref} > W_i,$$

wherein $W_{ref}$ is the weighting value of the reference element $E_{ref}$, $W_i$ is the weighting value of the composed element $E_i$, N is a positive integer greater than 1, i and n are positive integers greater than or equal to 0 and less than N;
- an auxiliary DAC having a M-bit digital input, and an output of the auxiliary DAC is coupled to the reference element $E_{ref}$, wherein M is a positive integer greater than 1;
- a comparator having a first input terminal, a second input terminal, and an output terminal, adapted for comparing the inputs of the first input terminal and the second input terminal, and outputting a comparison result at the output terminal;
- a SAR logic circuit coupled to the comparator, the auxiliary DAC, and the DAC, adapted for selecting one of a first value $V_1$ and a second value $V_0$ as the input values of all of the composed elements $E_0, E_1, \ldots, E_{N-1}$ according to an output of the comparator, so as to obtain a corresponding digital value of an input voltage; and
- a search control circuit coupled to the SAR logic circuit, the search control circuit controlling the SAR logic circuit to select one of the first value $V_1$ and the second value $V_0$ as the input values of all of the composed elements $E_0, E_1, \ldots, E_{N-1}$ according to the output of the comparator, and according to the output of the comparator, changing the binary values of the M-bit input of the auxiliary DAC, so as to adjust the input value of the reference element $E_{ref}$, and according to the binary values of the M-bit input of the auxiliary DAC and the input values of all the composed elements, the SAR ADC evaluates the weighting values of all the composed elements.

24. The SAR ADC as claimed in claim 23, wherein:
during a first phase of an $0^{th}$ period, inputting the first value $V_1$ for the composed element $E_0$ and inputting the second value $V_0$ for the other composed elements $E_1, \ldots, E_{N-1}$, so an equivalent open circuit output is $V_{MCW0}$;
during a second phase of the $0^{th}$ period, inputting the second value $V_0$ for all of the composed elements $E_0, E_1, \ldots, E_{N-1}$, and adjusting the input value of the reference element $E_{ref}$, so the equivalent open circuit output $V_{dig0}$ is approximately equal to $V_{MCW0}$, and according to the input value of the reference element $E_{ref}$, obtaining a rational multiple $K_{ref,0}$ less than 1, wherein, $$W_0 = K_{ref,0} * W_{ref};$$

during the first phase of an $i^{th}$ period, inputting the first value $V_1$ for the composed element $E_i$, and inputting the second value $V_0$ for the other composed elements $E_0, \ldots, E_{i-1}, E_{i+1}, \ldots, E_{N-1}$, so the equivalent open circuit output is $V_{MCWi}$; and
during the second phase of the $i^{th}$ period, inputting the second value $V_0$ for the composed elements $E_i, E_{i+i}, \ldots, E_{N-1}$ labeled greater than or equal to i, adjusting the input value of the reference element $E_{ref}$, and selecting one of the first value $V_1$ and the second value $V_0$ as the input values of the composed elements $E_0, E_1, \ldots, E_{i-1}$, so the equivalent open circuit output $V_{digi}$ is approximately equal to $V_{MCWi}$, and according to the input value of the reference element $E_{ref}$ and the input values of the composed elements $E_0, E_1, E_{i-1}$, obtaining the coefficients $K_{0,i}, K_{1,i}, \ldots, K_{i-1,i}$ and a rational multiple $K_{ref,i}$ less than 1, wherein, $$K_{0,i}, K_{1,i}, \ldots K_{i-1,i} \in \{0, 1\}, \text{ and}$$

$$W_i = \sum_{n=0}^{i-1} K_{n,i} * W_n + K_{ref,i} * W_{ref}.$$

25. The SAR ADC as claimed in claim 23, wherein the weighting values of the composed elements satisfy:

$$W_n = \alpha^n * W_0,$$

wherein a radix $\alpha$ is less than 2.

26. The SAR ADC as claimed in claim 25, wherein the radix $\alpha$ is 1.86.

27. The SAR ARC as claimed in claim 23, wherein the composed elements and the reference element are one of capacitors, resistors, and current sources.

28. The SAR ADC as claimed in claim 23, further comprising:
- a sample and hold circuit coupled to the comparator, adapted for sampling and holding the input voltage.

* * * * *